(12) United States Patent
Okamoto et al.

(10) Patent No.: US 12,063,747 B2
(45) Date of Patent: Aug. 13, 2024

(54) SURFACE-TREATED COPPER FOIL, COPPER-CLAD LAMINATE AND PRINTED WIRING BOARD USING THE SURFACE-TREATED COPPER FOIL

(71) Applicant: FUKUDA METAL FOIL & POWDER CO., LTD., Kyoto (JP)

(72) Inventors: Takeshi Okamoto, Kyoto (JP); Kenta Miyamoto, Kyoto (JP)

(73) Assignee: FUKUDA METAL FOIL & POWDER CO., LTD., Kyoto (JP)

( * ) Notice: Subject to any disclaimer, the term of this patent is extended or adjusted under 35 U.S.C. 154(b) by 0 days.

(21) Appl. No.: 18/276,590

(22) PCT Filed: Feb. 1, 2022

(86) PCT No.: PCT/JP2022/003721
§ 371 (c)(1),
(2) Date: Aug. 9, 2023

(87) PCT Pub. No.: WO2022/215330
PCT Pub. Date: Oct. 13, 2022

(65) Prior Publication Data
US 2024/0215172 A1   Jun. 27, 2024

(30) Foreign Application Priority Data
Apr. 9, 2021 (JP) ................. 2021-066587

(51) Int. Cl.
| B32B 3/00 | (2006.01) |
| H05K 1/09 | (2006.01) |
| H05K 3/02 | (2006.01) |
| H05K 3/38 | (2006.01) |

(52) U.S. Cl.
CPC ............... *H05K 3/022* (2013.01); *H05K 1/09* (2013.01); *H05K 3/384* (2013.01); *H05K 2201/0355* (2013.01)

(58) Field of Classification Search
CPC ........... H05K 3/022; H05K 3/384; H05K 1/09
See application file for complete search history.

(56) References Cited

FOREIGN PATENT DOCUMENTS

| JP | 2015-042779 A | 3/2015 |
| JP | 2015-061756 A | 4/2015 |
| JP | 2015-061935 A | 4/2015 |
| JP | 2016-146477 A | 8/2016 |

(Continued)

OTHER PUBLICATIONS

Mar. 8, 2022 Written Opinion issued in PCT/JP2022/003721.
Mar. 8, 2022 International Search Report issued in PCT/JP2022/003721.

*Primary Examiner* — Elizabeth E Mulvaney
(74) *Attorney, Agent, or Firm* — Oliff PLC

(57) ABSTRACT

A surface-treated copper foil includes, on at least one surface of an untreated copper foil, a finely roughened layer formed of copper particles in which primary particles have a particle size of 10 nm to 110 nm or less, and a heat-resistant-treatment layer containing nickel and phosphorus, wherein a treated surface has a surface area ratio of 5.1 or more per 1 $m^2$ of a two-dimensional area, the surface area ratio being calculated from a specific surface area measured by a krypton gas adsorption BET method, and a coating mass of the nickel is 2 mg or more per 1 $m^2$ of a surface area.

8 Claims, 3 Drawing Sheets

(56) References Cited

FOREIGN PATENT DOCUMENTS

| | | | | |
|---|---|---|---|---|
| JP | 2017-172048 A | 9/2017 | | |
| WO | 2017/138338 A1 | 8/2017 | | |
| WO | 2020/031721 A1 | 2/2020 | | |
| WO | WO-2020162056 A1 * | 8/2020 | ............. | B32B 15/14 |
| WO | WO-2020162068 A1 * | 8/2020 | ............. | B32B 15/08 |
| WO | WO-2020230870 A1 * | 11/2020 | ................ | C08J 7/06 |

* cited by examiner

SURFACE AREA RATIO: 4.2

×200,000   ×100,000

US 12,063,747 B2

SURFACE-TREATED COPPER FOIL, COPPER-CLAD LAMINATE AND PRINTED WIRING BOARD USING THE SURFACE-TREATED COPPER FOIL

TECHNICAL FIELD

The present invention relates to a surface-treated copper foil suitably used for printed wiring boards for transmission of high-frequency signals. Specifically, the present invention relates to the surface-treated copper foil that has a treated surface having a three-dimensional structure formed of a plurality of fine copper particles connected together, and having a high surface area ratio per 1 m$^2$ of the two-dimensional area to provide a strong anchoring effect to thereby exhibit high adhesion even to low-dielectric-constant resin base materials; the surface-treated copper foil includes a heat-resistant-treatment layer containing different metals of nickel and phosphorus, hence the copper particles are less likely to be oxidized even upon exposure to high temperatures for a long time, so that swelling and delamination are less likely to occur at the interface between the insulating resin base material and the copper foil; the surface-treated copper foil has good transmission characteristics similar to those of unroughened copper foils; in addition, such insulating resin base materials can be bonded together, so that multilayer printed wiring boards having high interlayer adhesion can also be produced.

BACKGROUND ART

For various communication devices, computers, and cellular phones, printed wiring boards in which conductive copper wiring patterns are formed on insulating resin base materials such as epoxy resin or polyimide resin have been used.

In recent years, toward, for example, the prevalence of services using the fifth generation mobile communications system (5G) and automobiles equipped with the advanced driving assistant system (ADAS), various devices using radio waves having high frequencies beyond 3 GHz or even using radio waves referred to as millimeter waves and having very high frequencies of 30 GHz or higher have been developed; with this, there has been an increasing demand for printed wiring boards designed for high-frequency signal transmission and multilayer printed wiring boards designed also for high-speed high-capacity transmission.

In transmission of high-frequency signals in printed wiring boards, the higher the frequencies of the signals, the larger the attenuation amounts, so that the transmission characteristics degrade.

Let us assume that such a printed wiring board is a microstrip-line-structure circuit having two terminals; the transmission characteristics of signals transmitted through the circuit can be represented by S parameters; when signals input from Terminal 1 are output from Terminal 2, the degree of signal loss between the terminals due to attenuation is referred to as insertion loss (S21).

The insertion loss (S21) is represented by the following [Math. 1] where input power is defined as $P_{in}$, output power is defined as $P_{out}$, and the unit is defined as dB (decibel).

$$S21(\text{dB}) = 10\log_{10}\left(\frac{P_{out}}{P_{in}}\right) \quad [\text{Math. 1}]$$

For example, in [Math. 1], when the input power $P_{in}$ is 100, the output power $P_{out}$ is 80, and hence the signal loss is 20%, the insertion loss (S21) is −1.0 dB; when $P_{in}$ is 100, $P_{out}$ is 50, and hence the signal loss is 50%, the insertion loss (S21) is −3.0 dB; thus, the larger the signal loss, the larger the absolute value of the insertion loss.

In general, in order to transmit signals, the insertion loss needs to be suppressed to −3.0 dB or more, in other words, the signal loss needs to be suppressed to 50% or less.

However, as described above, with an increase in the frequency, the signal loss increases and hence the absolute value of the insertion loss increases.

This is inferentially because the dielectric loss of the insulating resin base material and the conductor loss of the copper foil that serve as constituent elements of the printed wiring board depend on the frequency.

Thus, in order to address the recent trend toward higher frequencies of signals, there have been an increasing demand for development of a low-dielectric-constant resin base material that can suppress further the insertion loss and an increasing demand for development of a copper foil that exhibits low conductor resistance.

Examples of the low-dielectric-constant resin base material include polyphenylene ether resins, liquid crystal polymer resins, and fluororesins.

These low-dielectric-constant resin base materials all have good dielectric characteristics; however, adhesion to copper foils is less likely to be ensured, which is problematic.

This is because the low-dielectric-constant resin base materials are often resins having molecular structures that have low polarity and are less likely to undergo orientation polarization, so that the intermolecular force at the interface between such an insulating resin base material and a copper foil is weak and the chemical adhesion force is less likely to be provided.

As the methods of lowering the conductor resistance of a copper foil, there are a method of lowering the surface roughness of an untreated copper foil serving as the parent material of the surface-treated copper foil, a method of reducing the amount of roughening for increasing the physical adhesion force to the insulating resin base material (anchoring effect), and a method of reducing the amount of the metal treatment for improving the heat resistance.

These methods are all intended to suppress an increase in the transmission distance due to signals flowing along irregularities in the copper foil surface, the flowing being caused by, what is called, "skin effect" in which, the higher the frequency, the shallower the transmission signal depth and the higher the probability of near-surface signal transmission.

However, when the amount of roughening is reduced in order to reduce the surface irregularities, the anchoring effect for the insulating resin base material becomes weak and the physical adhesion force at the interface between the insulating resin base material and the copper foil lowers, which is problematic.

In addition, when copper-clad laminates using surface-treated copper foils having small amounts of roughening are used to produce a multilayer printed wiring board, the interlayer adhesion lowers, which is problematic.

This is because, when an insulating resin base material and a surface-treated copper foil are bonded together to produce a copper-clad laminate and subsequently the copper foil of the copper-clad laminate is etched to be completely removed, the structure of the treated surface of the copper foil is inversely reproduced in the exposed surface of the insulating resin base material, so that protruding regions on the copper foil side correspond to recessed regions on the insulating resin base material side; for a multilayer printed wiring board, the recessed regions on the insulating resin base material side are filled with a resin to bond together insulating resin base materials to provide the multilayer; thus, a reduction in the amount of roughening results in a reduction in the amount of irregularities and a reduction in the amount of recessed regions filled with the resin, so that the anchoring effect becomes weak.

When the amount of the metal treatment is reduced, oxidization of the copper foil tends to proceed upon exposure to a high temperature or high humidity environment, swelling occurs at the interface between the insulating resin base material and the copper foil, and delamination tends to occur, which is problematic.

Use of low-dielectric-constant resin base materials having low polarity causes more noticeable lowering of the adhesion and delamination.

Thus, there is a demand for the development of a surface-treated copper foil that can be suitably used for printed wiring boards for transmission of high-frequency signals, can suppress insertion loss during transmission of high-frequency signals, has sufficient adhesion to various low-dielectric-constant resin base materials and sufficient heat resistance, is less likely to delaminate, and can be used to provide a multilayer to produce a multilayer printed wiring board also having high interlayer adhesion.

CITATION LIST

Patent Literature

PTL 1: Japanese Unexamined Patent Application Publication No. 2017-106068
PTL 2: WO2003/102277

SUMMARY OF INVENTION

Technical Problem

PTL 1 discloses a surface-treated copper foil that suppresses transmission loss (insertion loss) during transmission of high-frequency signals, and has high adhesion and high durability at the interface between the insulating resin base material and the copper foil under high temperature or harsh conditions.

For the surface-treated copper foil disclosed in PTL 1, the height of roughened particles is suppressed to 0.05 μm or more and less than 0.5 μm, the surface area ratio (the ratio of the three-dimensional area to the two-dimensional area) of the roughened surface is set to 1.2 or more, and the nickel element content of the metal treatment layer is set to 0.1 mg/dm$^2$ or more and less than 0.3 mg/dm$^2$, to thereby attempt to suppress the transmission loss and to suppress the peeling strength deterioration ratio after heating for a long term.

However, for the surface-treated copper foil disclosed in PTL 1, when the surface area ratio is close to the lower limit, sufficient adhesion to the insulating resin base material or sufficient heat resistance may not be ensured and, in the case of producing a multilayer printed wiring board, interlayer adhesion may not be ensured.

In addition, since the metal treatment layer has a low nickel content, even in the case of an increased surface area ratio, in temperature regions higher than 150° C., the adhesion or heat resistance is low and swelling occurs at the interface between the insulating resin base material and the copper foil, for example, which is problematic.

Note that, in the method disclosed in PTL 1, the surface area ratio of the unroughened surface is regarded as 1 and this surface area ratio of 1 is subtracted from the surface area ratio of the surface-treated copper foil to thereby calculate the surface area ratio of the roughened surface; thus, the surface area ratio of the surface-treated copper foil in terms of the roughened surface and the unroughened surface, that is, both of the surfaces (the surface area ratio in the present invention) is 2.2 or more.

PTL 2 discloses a surface-treated copper foil that sufficiently ensures bonding strength to a low-dielectric-constant base material and can minimize the transmission loss.

In the surface-treated copper foil disclosed in PTL 2, a roughened layer formed of nodular copper particles having a particle size of 0.5 μm to 3.0 μm was formed on the surface of an untreated copper foil, ultrafine copper particles having a particle size of 0.1 μm to 1.0 μm were deposited on the roughened layer, and a zinc-nickel anticorrosive treatment layer is formed on the surface of the ultrafine copper particles such that the zinc-nickel total coating mass is 20 to 60 mg/m$^2$ and the surface roughness is an Rz of 1.0 μm to 6.5 μm, to thereby attempt to increase the adhesion to the low-dielectric-constant base material.

This method ensures heat resistance, for example, adhesion after immersion in solder or interlayer adhesion in the case of providing a multilayer printed wiring board; however, the presence of nodular copper particles or the influence of ultrafine copper particles results in an increase in the transmission loss (insertion loss), which is problematic.

For a technical object of addressing the above-described problems, the inventors of the present invention performed a large number of trial-and-error prototype fabrications and experiments and, as a result, have found the following noteworthy findings: for a surface-treated copper foil including, on at least one surface of an untreated copper foil, a roughened layer, and a heat-resistant-treatment layer disposed on the roughened layer, wherein the roughened layer is a finely roughened layer formed of copper particles in which primary particles have a particle size of 10 nm or more and 110 nm or less, the heat-resistant-treatment layer contains nickel and phosphorus, a treated surface of the surface-treated copper foil has a surface area ratio of 5.1 or more per 1 m$^2$ of a two-dimensional area, the surface area ratio being calculated from a specific surface area measured by a krypton gas adsorption BET method, and a coating mass of the nickel per 1 m$^2$ of a surface area is 2 mg or more, the surface-treated copper foil provides a strong anchoring effect, hence exhibits high adhesion to insulating resin base materials, and exhibits high adhesion even to low-dielectric-constant resin base materials; even upon exposure to high temperatures for a long time, swelling and delamination at the interface between such an insulating resin base material and the copper foil are less likely to occur; the surface-treated copper foil has good transmission characteristics similar to those of unroughened copper foils; such insulating resin base materials can be bonded together to thereby also produce multilayer printed wiring boards having high interlayer adhesion; thus, the inventors have achieved the above-described technical object.

Solution to Problem

The above-described technical object can be achieved by the present invention as described below.

The present invention provides a surface-treated copper foil including, on at least one surface of an untreated copper foil, a roughened layer, and a heat-resistant-treatment layer disposed on the roughened layer, wherein the roughened layer is a finely roughened layer formed of copper particles in which primary particles have a particle size of 10 nm or more and 110 nm or less, the heat-resistant-treatment layer contains nickel and phosphorus, a treated surface of the surface-treated copper foil has a surface area ratio of 5.1 or more per 1 $m^2$ of a two-dimensional area, the surface area ratio being calculated from a specific surface area measured by a krypton gas adsorption BET method, and a coating mass of the nickel per 1 $m^2$ of a surface area is 2 mg or more.

The present invention also provides the surface-treated copper foil wherein the coating mass of the nickel per 1 $m^2$ of the surface area is 60 mg or less.

The present invention also provides the surface-treated copper foil wherein a coating mass of the phosphorus per 1 $m^2$ of the surface area is 0.1 mg or more.

The present invention also provides the surface-treated copper foil wherein the treated surface has an arithmetic mean deviation Sa of 0.02 μm or more and 0.35 μm or less.

The present invention also provides the surface-treated copper foil including, on the heat-resistant-treatment layer, a chromate treatment layer and/or a silane-coupling-agent treatment layer.

The present invention also provides a copper-clad laminate in which such a surface-treated copper foil is bonded to an insulating resin base material.

The present invention also provides the copper-clad laminate wherein the insulating resin base material is a low-dielectric-constant resin base material.

The present invention also provides a printed wiring board or multilayer printed wiring board formed using such a copper-clad laminate.

Advantageous Effects of Invention

The present invention provides a surface-treated copper foil in which a roughened layer is constituted by fine copper particles in which primary particles have a particle size of 10 nm to 110 nm, but a high surface area ratio of 5.1 or more per 1 $m^2$ of the two-dimensional area is achieved, the surface area ratio being calculated from a specific surface area measured by the krypton gas adsorption BET method.

The treated surface is constituted by fine particles but has a high surface area ratio, so that its structure is, as illustrated in [FIG. 2] and [FIG. 3], a three-dimensional structure formed of a plurality of fine copper particles connected together.

Thus, the treated surface and an insulating resin base material are bonded together and heat-pressed, so that the treated surface and a surface of the insulating resin base material adhere to each other three-dimensionally in large areas to provide a strong anchoring effect; hence, the surface-treated copper foil has high adhesion to the insulating resin base material.

A surface-treated copper foil according to the present invention exerts a strong anchoring effect and hence is a surface-treated copper foil that exhibits high adhesion even to low-polarity low-dielectric-constant resin base materials.

In addition, according to the present invention, the structure of the treated surface is a three-dimensional structure formed of a plurality of fine copper particles connected together, so that the structure reproduced in the surface of the insulating resin base material after the copper foil is etched off also has a three-dimensional surface structure similar to the surface structure of the surface-treated copper foil; thus, the surface of the insulating resin base material from which the copper foil has been removed and a new insulating resin base material are laminated together, so that the resin fills fine recessed portions having a high surface area ratio to achieve bonding in larger areas, to exert a strong anchoring effect; thus, the surface-treated copper foil can be used to produce a multilayer printed wiring board having high interlayer adhesion.

In addition, the roughened layer is formed of fine copper particles in which primary particles have a particle size of 10 nm to 110 nm, so that the surface-treated copper foil can be used to produce a printed wiring board in which, even in the case of transmission of high-frequency signals, insertion loss due to the skin effect is suppressed and transmission characteristics similar to those of unroughened copper foils can be achieved.

In addition, the heat-resistant-treatment layer according to the present invention contains different metals of nickel and phosphorus and the coating mass of the nickel is 2 mg or more per 1 $m^2$ of the surface area, so that the surfaces of the roughened particles are protected by nickel and phosphorus; thus, even upon exposure to a high temperature of about 150° C. to about 280° C. for 1 hour or more, fine copper particles are less likely to be oxidized and occurrence of swelling at the interface between the insulating resin base material and the copper foil can be suppressed, to thereby achieve high heat resistance.

In addition, when, on the heat-resistant-treatment layer, a chromate treatment layer and/or a silane-coupling-agent treatment layer is disposed, even upon exposure to a high temperature of about 300° C. for 1 hour or more, occurrence of swelling at the interface between the insulating resin base material and the copper foil can be suppressed, to thereby achieve higher heat resistance.

In addition, when the coating mass of the nickel is 60 mg or less per 1 $m^2$ of the surface area, in the surface-treated copper foil, the copper foil is easily removed by soft etching.

In addition, when the coating mass of the phosphorus per 1 $m^2$ of the surface area is 0.1 mg or more, in the surface-treated copper foil, the copper foil is easily removed by soft etching.

In addition, when the treated surface has an arithmetic mean deviation Sa of 0.02 μm to 0.35 μm, the insertion loss due to the skin effect is further suppressed, so that the surface-treated copper foil can be used to produce a printed wiring board having good transmission characteristics.

Therefore, a surface-treated copper foil according to the present invention can be suitably used to produce printed wiring boards or multilayer printed wiring boards for transmission of high-frequency signals.

DESCRIPTION OF EMBODIMENTS

<Untreated Copper Foil>

Figure 1:
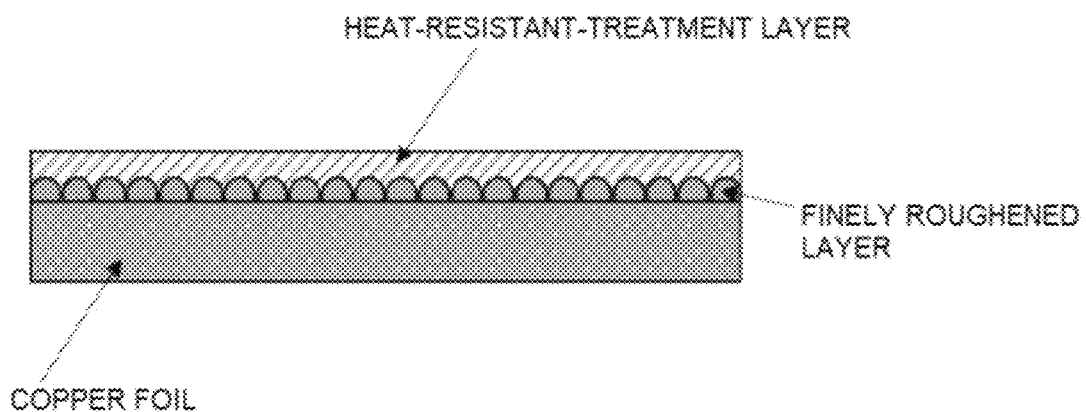
FIG. 1 is a schematic view of a surface-treated copper foil according to the present invention.
Figure 2:
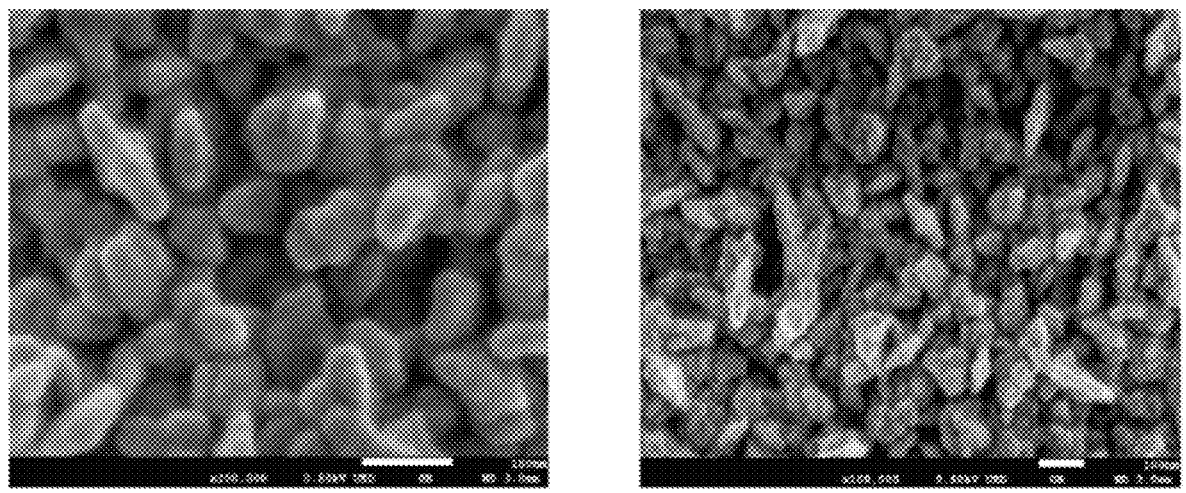
FIG. 2 includes scanning electron micrographs taken at magnifications of 200,000 and 100,000 for a surface-treated copper foil of Example 1 (surface area ratio: 8.8).
Figure 3:
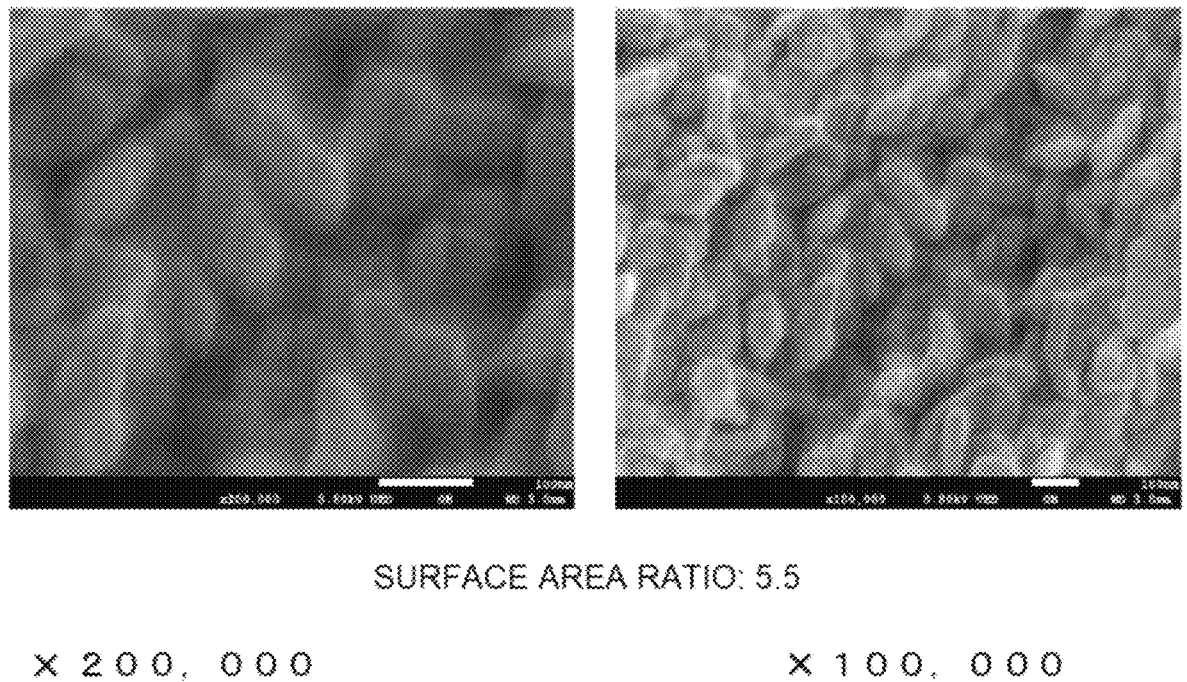
FIG. 3 includes scanning electron micrographs taken at magnifications of 200,000 and 100,000 for a surface-treated copper foil of Example 8 (surface area ratio: 5.5)
Figure 4:
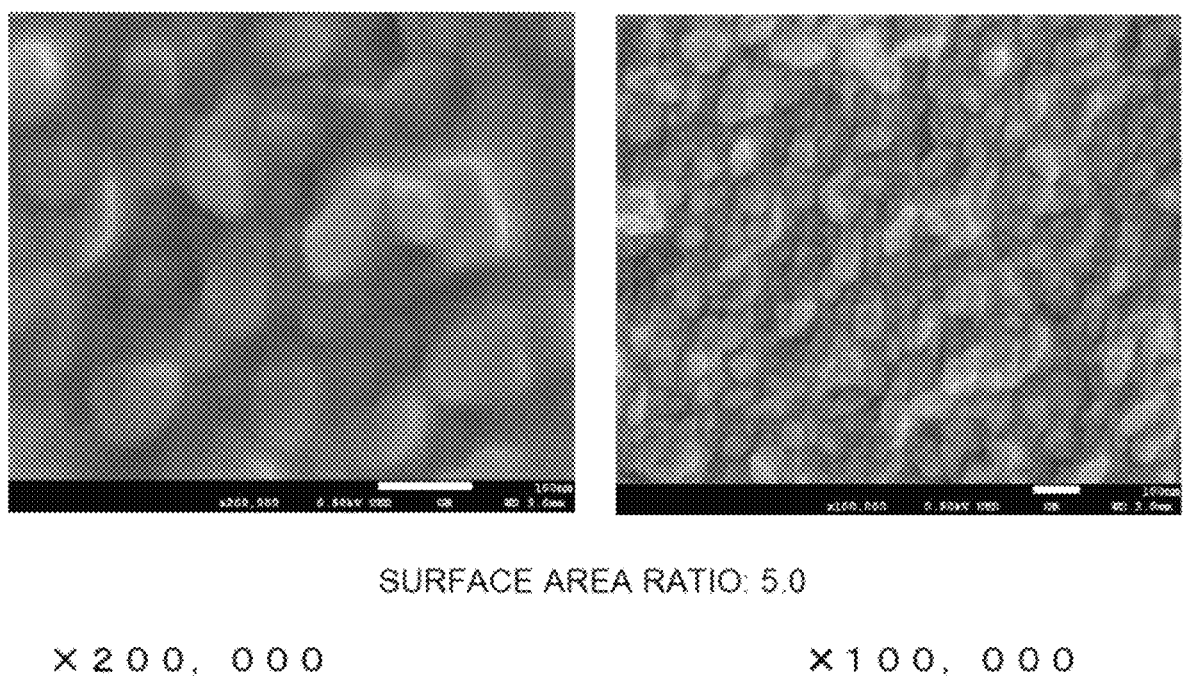
FIG. 4 includes scanning electron micrographs taken at magnifications of 200,000 and 100,000 for a surface-treated copper foil of Comparative Example 12 (surface area ratio: 5.0).
Figure 5:
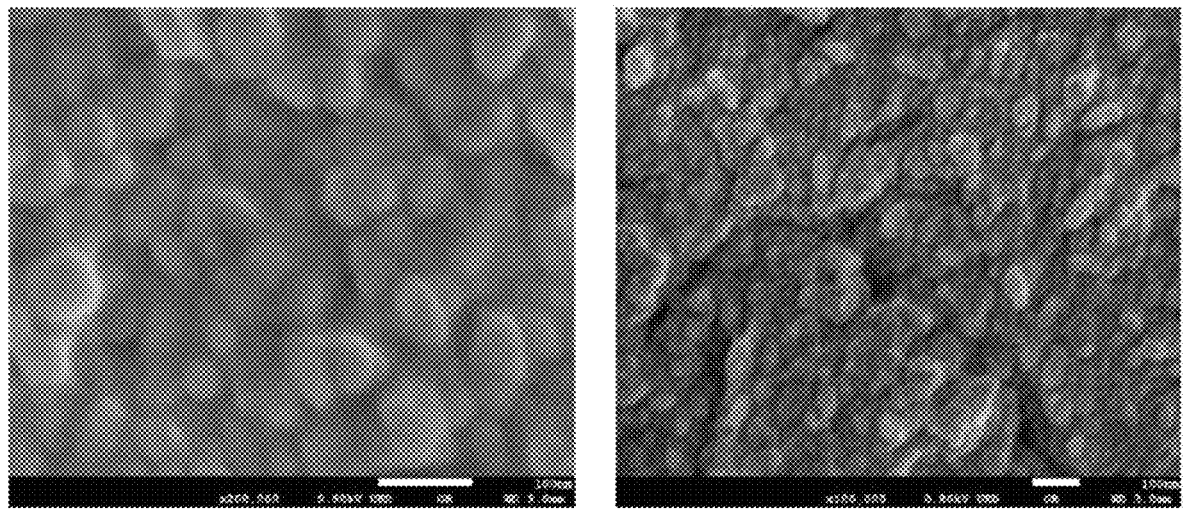
FIG. 5 includes scanning electron micrographs taken at magnifications of 200,000 and 100,000 for a surface-treated copper foil of Comparative Example 11 (surface area ratio: 4.2).

A copper foil used for the present invention (hereafter, referred to as "untreated copper foil") is not particularly limited; a copper foil whose front and back surfaces are indistinguishable from each other or a copper foil whose front and back surfaces are distinguishable from each other, such as a rolled copper foil or an electrodeposited copper foil, can be used.

One of the surfaces that is subjected to the surface treatment is not particularly limited; for a rolled copper foil, any of the surfaces is naturally selected; also for an electrodeposited copper foil, the deposition surface or the drum surface may be selected.

In the case of using a rolled copper foil, it is preferably immersed in a hydrocarbon organic solvent or an alkaline degreasing liquid to remove the rolling oil and subsequently subjected to the surface treatment.

In the case of using an electrodeposited copper foil, it is preferably immersed in dilute sulfuric acid to remove the oxide film and subsequently subjected to the surface treatment.

The thickness of the untreated copper foil is not particularly limited as long as the post-surface-treatment thickness can be used for a printed wiring board, and is preferably 6 μm to 300 μm, more preferably 12 μm to 35 μm.

For each surface of the untreated copper foil measured in accordance with JIS B 0681-3, using a confocal microscope (laser microscope) in accordance with ISO 25178-607, the arithmetic mean deviation Sa is preferably 0.6 μm or less, more preferably 0.3 μm or less.

This is because an arithmetic mean deviation Sa of more than 0.6 μm may result in an increase in the insertion loss.

The surface area ratio of the untreated copper foil per 1 m² of the two-dimensional area, the surface area ratio being calculated from the specific surface area measured by the krypton gas adsorption BET method, is preferably 2 to 4.

<Finely Roughened Layer>

The present invention provides a surface-treated copper foil including, on an untreated copper foil, a finely roughened layer formed of fine copper particles.

The primary particles of the copper particles constituting the finely roughened layer have a particle size of preferably 10 nm to 110 nm, more preferably 20 nm to 100 nm.

This is because, when a large number of primary particles have a particle size of less than 10 nm, upon exposure of the copper-clad laminate bonded to an insulating resin base material to a high temperature of about 150° C. to about 300° C. for 1 hour or more, swelling may occur at the interface between the insulating resin base material and the copper foil and sufficient heat resistance may not be provided; in addition, when the copper-clad laminate is used to form a printed wiring board and subsequently further bonded to an insulating resin base material to form a multilayer, sufficient interlayer adhesion may not be provided.

In addition, when a large number of particles have a particle size of more than 110 nm, the surface roughness may increase and the insertion loss may become high.

Figure 6:
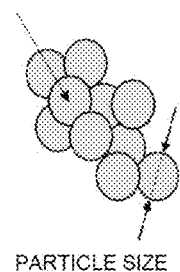
FIG. 6 is a schematic view of copper particles forming a finely roughened layer according to the present invention.

The particle size is measured using a field-emission scanning electron microscope at a tilt angle of 0° and at a magnification of 100,000 to 200,000; as illustrated in FIG. 6, the longest diameter of the primary particles is measured.

<Heat-Resistant-Treatment Layer>

The present invention provides a surface-treated copper foil including, on a finely roughened layer, a heat-resistant-treatment layer.

The nickel coating mass of the heat-resistant-treatment layer is, per 1 m² of the surface area, preferably 2 mg or more, more preferably 3 mg or more.

This is because, when the nickel coating mass is less than 2 mg, in a copper-clad laminate provided by bonding to an insulating resin base material, upon exposure to a high temperature of about 150° C. to about 300° C. for 1 hour or more, swelling may occur at the interface between the insulating resin base material and the copper foil and sufficient heat resistance may not be provided.

Note that, in a step of forming a blind via in a printed wiring board, a hole is formed in the printed wiring board, desmear is performed, and subsequently, during copper plating for the inner wall or the copper foil surface, the copper foil surface is subjected to, as an undercoating treatment for improving the adhesion, degreasing, pickling, or soft etching; when the nickel coating mass per 1 m² of the surface area is more than 60 mg, soft etching of a copper foil surface including a finely roughened layer may take a long etching time, etching failure may occur, and adhesion failure of the copper coating may occur.

The nickel coating mass per 1 m² of the surface area can be determined using the following [Math. 2].

$$\text{Nickel coating mass per 1 m}^2 \text{ of surface area (mg)} = \frac{\text{Nickel coating mass per 1 m}^2 \text{ of two-dimensional area (mg)}}{\text{Surface area ratio} \times \text{Two-dimensional area (m}^2\text{)}} \quad \text{[Math. 2]}$$

The phosphorus coating mass of the heat-resistant-treatment layer is, per 1 m² of the surface area, preferably 0.1 mg or more.

When the phosphorus coating mass is less than 0.1 mg, even when the nickel coating mass is 60 mg or less, soft etching may take a long etching time, etching failure may occur, and adhesion failure of the copper coating may occur.

The phosphorus coating mass per 1 m² of the surface area can be determined using the following [Math. 3].

$$\text{Phosphorus coating mass per 1 m}^2 \text{ of surface area (mg)} = \frac{\text{Phosphorus coating mass per 1 m}^2 \text{ of two-dimensional area (mg)}}{\text{Surface area ratio} \times \text{Two-dimensional area (m}^2\text{)}} \quad \text{[Math. 3]}$$

In the present invention, for the treated surface including a finely roughened layer and a heat-resistant-treatment layer, the surface area ratio per 1 m$^2$ of the two-dimensional area, the surface area ratio being calculated from the specific surface area measured by the krypton gas adsorption BET method, is preferably 5.1 or more, more preferably 5.5 or more.

This is because, when the surface area ratio is less than 5.1, upon exposure of a copper-clad laminate provided by bonding to an insulating resin base material to a high temperature of about 150° C. to about 300° C. for 1 hour or more, swelling may occur at the interface between the insulating resin base material and the copper foil and sufficient heat resistance may not be provided, and, in the case of forming a multilayer, sufficient interlayer adhesion may not be provided.

<Calculation of Surface Area Ratio>

The surface area ratio of the treated surface can be calculated by subjecting the krypton-gas-adsorption-BET specific-surface-area measured value to multiplication by the mass of a sample and division by the area of the sample.

In a surface-treated copper foil according to the present invention, for the treated surface including a finely roughened layer and a heat-resistant-treatment layer, the arithmetic mean deviation Sa is preferably 0.02 μm to 0.35 μm, more preferably 0.02 μm to 0.15 μm.

This is because, when the arithmetic mean deviation Sa is less than 0.02 μm, the anchoring effect may become weak; when the arithmetic mean deviation Sa is more than 0.35 μm, the insertion loss may increase.

The finely roughened layer can be formed by electrolysis with an untreated copper foil being immersed in an electrolyte solution prepared by adding 50 to 150 g/L of a diethylenetriamine compound to 10 to 70 g/L of copper sulfate pentahydrate and adjusting the resultant aqueous solution, using sulfuric acid or sodium hydroxide, to pH 3 to 6.

The electrolysis can be performed using an insoluble electrode of, for example, platinum-group oxide-coated titanium serving as an anode and being immersed in the electrolyte solution, and an untreated copper foil disposed so as to face the anode with a certain clearance therebetween, serving as a cathode, and being immersed in the electrolyte solution, under conditions of an electric current density of 1.0 to 9.0 A/dm$^2$, a quantity of electricity of 40 to 90 C/dm$^2$, and a liquid temperature of 25 to 50° C.

The diethylenetriamine compound added to the electrolyte solution is not particularly limited and is, for example, pentasodium diethylenetriaminepentaacetate.

The heat-resistant-treatment layer can be formed by electrolysis using the copper foil having the finely roughened layer formed on the untreated copper foil, the copper foil being immersed in an electrolyte solution.

The electrolyte solution for forming the heat-resistant-treatment layer is preferably an aqueous solution containing 10 to 70 g/L of a nickel-containing compound, 2 to 40 g/L of an acetate, and 0.1 to 10.0 g/L of a hypophosphite, the aqueous solution being prepared to a pH of 4.0 to 5.5.

The electrolysis is preferably performed using an insoluble electrode of, for example, platinum-group oxide-coated titanium serving as an anode and being immersed in the electrolyte solution, and the copper foil disposed so as to face the anode with a certain clearance therebetween, having the finely roughened layer, serving as a cathode, and being immersed in the electrolyte solution, under electrolysis conditions of an electric current density of 0.5 to 3.5 A/dm$^2$, a quantity of electricity of 2.5 to 22 C/dm$^2$, and a liquid temperature of 25 to 50° C.

The nickel-containing compound contained in the electrolyte solution is not particularly limited and examples include nickel sulfate hexahydrate, nickel chloride hexahydrate, and nickel acetate tetrahydrate.

The acetate contained in the electrolyte solution is not particularly limited and examples include sodium acetate trihydrate.

The hypophosphite contained in the electrolyte solution is not particularly limited and examples include disodium hydrogen phosphite, sodium hypophosphite monohydrate, and nickel hydrogen phosphite.

<Chromate Treatment Layer and Silane-Coupling-Agent Treatment Layer>

In a surface-treated copper foil according to the present invention, on the heat-resistant-treatment layer, a chromate treatment layer and/or a silane-coupling-agent treatment layer can be disposed.

On the heat-resistant-treatment layer, the chromate treatment layer and/or the silane-coupling-agent treatment layer is disposed to thereby provide a surface-treated copper foil having higher heat resistance.

The chromate treatment layer can be formed by electrolysis using the copper foil having the heat-resistant-treatment layer and being immersed in an electrolyte solution.

The electrolyte solution for forming the chromate treatment layer is preferably an aqueous solution containing 10 to 60 g/L of a chromic acid-containing compound or an aqueous solution containing 10 to 60 g/L of a chromic acid-containing compound and 0.2 to 4.0 g/L of zinc ions, the aqueous solution being prepared using sulfuric acid or sodium hydroxide to a pH of 2 to 12.

The electrolysis is preferably performed using an insoluble electrode of, for example, platinum-group oxide-coated titanium serving as an anode and being immersed in the electrolyte solution and the copper foil disposed so as to face the anode with a certain clearance therebetween, having the heat-resistant-treatment layer, serving as a cathode, and being immersed in the electrolyte solution, under electrolysis conditions of an electric current density of 1.0 to 5.0 A/dm$^2$, a quantity of electricity of 2 to 6 C/dm$^2$, and a liquid temperature of 25 to 50° C.

The chromic acid-containing compound is not particularly limited and is, for example, sodium dichromate dihydrate.

The zinc ion source is not particularly limited and is, for example, zinc oxide.

In the present invention, on the chromate treatment layer or on the heat-resistant-treatment layer, a silane-coupling-agent treatment layer may be disposed.

The silane coupling agent used for the silane-coupling-agent layer is not particularly limited; silane coupling agents containing a vinyl group, an epoxy group, a styryl group, a methacrylic group, an acrylic group, an amino group, a ureido group, and a mercapto group can be used; silane coupling agents containing an amino group, an epoxy group, or a vinyl group have very strong effects of anti-hygroscopicity and anticorrosiveness, and can be more suitably used.

Such silane coupling agents may be used alone or in combination of two or more thereof.

It can be formed by subjecting the copper foil having the chromate treatment layer or the heat-resistant-treatment layer to immersion in or application such as spraying of a silane coupling agent aqueous solution prepared at a liquid temperature of 20 to 50° C., and subsequently to rinsing.

The composition and conditions of the aqueous solution for forming the silane-coupling-agent treatment layer are, for example, 1 to 5 mL/L of γ-aminopropyltriethoxysilane, a liquid temperature of 25 to 35° C., and an immersion time of 15 seconds.

<Insulating Resin Base Material>

The insulating resin base material to which a surface-treated copper foil according to the present invention is bonded is not particularly limited, and examples include epoxy resins and polyimide resins; examples of low-dielectric-constant resin base materials include polyphenylene ether resins, liquid crystal polymer resins, fluororesins, bismaleimidetriazine resins, and cycloolefin polymer resins.

EXAMPLES

Hereinafter, Examples of the present invention will be described; however, the present invention is not limited to these.

<Untreated Copper Foil>

As untreated copper foils of Examples and Comparative Examples, electrodeposited copper foils or rolled copper foils having a nominal thickness of 12 to 35 μm were used.

The rolled copper foils were immersed in an alkaline degreasing liquid to remove the rolling oil and subsequently subjected to surface treatments.

The electrodeposited copper foils were immersed in dilute sulfuric acid to remove the oxide films and subsequently subjected to surface treatments.

Example 1 and Example 1a to Example 1c

An example in which, on a heat-resistant-treatment layer, a chromate treatment layer and a silane-coupling-agent treatment layer were formed in this order is defined as Example 1; an example in which the chromate treatment layer and the silane-coupling-agent treatment layer were not formed is defined as Example 1a; an example in which the chromate treatment layer alone was formed is defined as Example 1b; and an example in which the silane-coupling-agent treatment layer alone was formed is defined as Example 1c.

<Formation of Finely Roughened Layer>

As the electrolyte solution, an aqueous solution containing 35 g/L of copper sulfate pentahydrate and 100 g/L of pentasodium diethylenetriaminepentaacetate, having a pH of 4.8, and having a liquid temperature of 32° C. was used; in the electrolyte solution, an insoluble electrode of platinum-group oxide-coated titanium serving as an anode was immersed, and an untreated copper foil disposed so as to face the anode with a certain clearance therebetween and serving as a cathode was immersed; electrolysis was performed at an electric current density of 5.0 A/dm$^2$ and a quantity of electricity of 60 C/dm$^2$ to form, on the untreated copper foil, a finely roughened layer.

<Formation of Heat-Resistant-Treatment Layer>

As the electrolyte solution, an aqueous solution containing 30 g/L of nickel sulfate hexahydrate, 2.3 g/L of sodium hypophosphite monohydrate, and 10 g/L of sodium acetate trihydrate, having a pH of 4.5, and having a liquid temperature of 32° C. was used.

In the electrolyte solution, an insoluble electrode of platinum-group oxide-coated titanium and serving as an anode was immersed, and the copper foil disposed so as to face the anode with a certain clearance therebetween, having the finely roughened layer, and serving as a cathode was immersed; electrolysis was performed at an electric current density of 2.5 A/dm$^2$ and at a quantity of electricity of 5 C/dm$^2$ to form, on the finely roughened layer, a heat-resistant-treatment layer.

<Formation of Chromate Treatment Layer>

As the electrolyte solution, an aqueous solution containing 12.5 g/L of sodium dichromate dihydrate and 2.5 g/L of zinc ions, having a pH of 12, and having a liquid temperature of 25° C. was used; in the electrolyte solution, an insoluble electrode of platinum-group oxide-coated titanium serving as an anode was immersed, and the copper foil disposed so as to face the anode with a certain clearance therebetween, having the heat-resistant-treatment layer, and serving as a cathode was immersed; electrolysis was performed at an electric current density of 4.3 A/dm$^2$ and at a quantity of electricity of 6 C/dm$^2$ to form, on the heat-resistant-treatment layer, a chromate treatment layer.

<Formation of Silane-Coupling-Agent Treatment Layer>

In an aqueous solution having a liquid temperature of 25° C. and containing 5 mL/L of γ-aminopropyltriethoxysilane, the copper foil having the heat-resistant-treatment layer or the copper foil having the chromate treatment layer was immersed for 10 seconds and dried to form, on the heat-resistant-treatment layer or on the chromate treatment layer, a silane-coupling-agent treatment layer to produce a surface-treated copper foil.

Example 2

Production was performed under the same conditions as in Example 1 except that, during formation of the heat-resistant-treatment layer, the electrolysis conditions were changed to a quantity of electricity of 10 C/dm$^2$.

Example 3 and Example 3a to Example 3c

An example in which, on the heat-resistant-treatment layer, the chromate treatment layer and the silane-coupling-agent treatment layer were formed in this order is defined as Example 3; an example in which the chromate treatment layer and the silane-coupling-agent treatment layer were not formed is defined as Example 3a; an example in which the chromate treatment layer alone was formed is defined as Example 3b; and an example in which the silane-coupling-agent treatment layer alone was formed is defined as Example 3c.

Production was performed under the same conditions as in Example 1 and Example 1a to Example 1c except that, during formation of the heat-resistant-treatment layer, the electrolysis conditions were changed to a quantity of electricity of 3 C/dm$^2$.

Example 4

Production was performed under the same conditions as in Example 1 except that, during formation of the finely roughened layer, the electrolysis conditions were changed to an electric current density of 7.0 A/dm$^2$ and a quantity of electricity of 80 C/dm$^2$, and, during formation of the heat-resistant-treatment layer, the electrolysis conditions were changed to a quantity of electricity of 3 C/dm$^2$.

Example 5 and Example 6

Production was performed under the same conditions as in Example 1 except that, during formation of the heat-resistant-treatment layer, the electrolysis conditions were changed to a quantity of electricity of 10 C/dm$^2$, and, during formation of the chromate treatment layer, as the electrolyte solution, an aqueous solution containing 20 g/L of sodium dichromate dihydrate, having a pH of 4.5, and having a liquid temperature of 25° C. was used, and the electrolysis conditions were changed to an electric current density of 2.2 A/dm$^2$ and a quantity of electricity of 3 C/dm$^2$.

Example 7

Production was performed under the same conditions as in Example 1 except that, during formation of the heat-resistant-treatment layer, the electrolysis conditions were changed to a quantity of electricity of 20 C/dm$^2$.

Example 8

Production was performed under the same conditions as in Example 1 except that, during formation of the finely roughened layer, the electrolysis conditions were changed to an electric current density of 4.0 A/dm$^2$ and a quantity of electricity of 50 C/dm$^2$; during formation of the heat-resistant-treatment layer, the electrolysis conditions were changed to a quantity of electricity of 10 C/dm$^2$; during formation of the chromate treatment layer, as the electrolyte solution, an aqueous solution containing 20 g/L of sodium dichromate dihydrate, having a pH of 4.5, and having a liquid temperature of 25° C. was used; and the electrolysis conditions were changed to an electric current density of 2.2 A/dm$^2$ and a quantity of electricity of 3 C/dm$^2$.

Example 9

Production was performed under the same conditions as in Example 1 except that, during formation of the heat-resistant-treatment layer, as the electrolyte solution, an aqueous solution containing 30 g/L of nickel sulfate hexahydrate, 0.4 g/L of sodium hypophosphite monohydrate, and 10 g/L of sodium acetate trihydrate, having a pH of 4.5, and having a liquid temperature of 32° C. was used, and the electrolysis conditions were changed to a quantity of electricity of 10 C/dm$^2$.

Example 10

Production was performed under the same conditions as in Example 1 except that, during formation of the heat-resistant-treatment layer, as the electrolyte solution, an aqueous solution containing 30 g/L of nickel sulfate hexahydrate, 2.0 g/L of sodium hypophosphite monohydrate, and 10 g/L of sodium acetate trihydrate, having a pH of 4.5, and having a liquid temperature of 32° C. was used, and the electrolysis conditions were changed to a quantity of electricity of 10 C/dm$^2$.

Example 11

Production was performed under the same conditions as in Example 1 except that, during formation of the chromate treatment layer, as the electrolyte solution, an aqueous solution containing 20 g/L of sodium dichromate dihydrate, having a pH of 4.5, and having a liquid temperature of 25° C. was used, and the electrolysis conditions were changed to an electric current density of 2.2 A/dm$^2$ and a quantity of electricity of 3 C/dm$^2$.

Example 12

Production was performed under the same conditions as in Example 1 except that, during formation of the heat-resistant-treatment layer, the electrolysis conditions were changed to a quantity of electricity of 15 C/dm$^2$; and, during formation of the chromate treatment layer, as the electrolyte solution, an aqueous solution containing 20 g/L of sodium dichromate dihydrate, having a pH of 4.5, and having a liquid temperature of 25° C. was used, and the electrolysis conditions were changed to an electric current density of 2.2 A/dm$^2$ and a quantity of electricity of 3 C/dm$^2$.

Comparative Example 1

Production was performed under the same conditions as in Example 1 except that the finely roughened layer was not formed.

Comparative Example 2

Production was performed under the same conditions as in Example 1 except that the finely roughened layer was not formed and, during formation of the heat-resistant-treatment layer, the electrolysis conditions were changed to a quantity of electricity of 3 C/dm$^2$.

Comparative Example 3

Production was performed under the same conditions as in Example 1 except that the finely roughened layer was not formed and, during formation of the heat-resistant-treatment layer, the electrolysis conditions were changed to a quantity of electricity of 10 C/dm$^2$.

Comparative Example 4 and Comparative Example 5

Production was performed under the same conditions as in Example 1 except that the finely roughened layer was not formed; during formation of the heat-resistant-treatment layer, the electrolysis conditions were changed to a quantity of electricity of 10 C/dm$^2$; and, during formation of the chromate treatment layer, as the electrolyte solution, an aqueous solution containing 20 g/L of sodium dichromate dihydrate, having a pH of 4.5, and having a liquid temperature of 25° C. was used, and the electrolysis conditions were changed to an electric current density of 2.2 A/dm$^2$ and a quantity of electricity of 3 C/dm$^2$.

Comparative Example 6

Production was performed under the same conditions as in Example 1 except that the finely roughened layer was not formed and, during formation of the heat-resistant-treatment layer, the electrolysis conditions were changed to a quantity of electricity of 20 C/dm$^2$.

Comparative Example 7

Production was performed under the same conditions as in Example 1 except that the finely roughened layer was not formed and, during formation of the heat-resistant-treatment layer, the electrolysis conditions were changed to a quantity of electricity of 6 C/dm$^2$.

Comparative Example 8

Production was performed under the same conditions as in Example 1 except that, as described in EXAMPLES of PTL 1, the electrolyte solution (98 g/L of copper sulfate pentahydrate, 180 g/L of sulfuric acid, 60 mg/L of molybdenum ions, and a liquid temperature of 25° C.) and the electrolysis conditions (an electric current density of 25.0 A/dm² and a quantity of electricity of 38 C/dm²) were used to form a roughened layer; and, during formation of the heat-resistant-treatment layer, as the electrolyte solution, an aqueous solution containing 30 g/L of nickel sulfate hexahydrate, 2 g/L of sodium hypophosphite monohydrate, and 10 g/L of sodium acetate trihydrate, having a pH of 4.5, and having a liquid temperature of 32° C. was used and the current conditions were changed to an electric current density of 0.5 A/dm² and a quantity of electricity of 2 C/dm².

Comparative Example 9

Production was performed under the same conditions as in Example 1 except that, during formation of the roughened layer, firstly, as an electrolyte solution, an aqueous solution containing 57 g/L of copper sulfate pentahydrate, 110 g/L of sulfuric acid, 15 mg/L of tungsten ions, and 30 mg/L of chloride ions and having a liquid temperature of 40° C. was used; in the electrolyte solution, an insoluble electrode of platinum-group oxide-coated titanium serving as an anode was immersed, and an untreated copper foil disposed so as to face the anode with a certain clearance therebetween and serving as a cathode was immersed; electrolysis was performed at an electric current density of 50.0 A/dm² and at a quantity of electricity of 125 C/dm² to form a dendritic particle layer on the untreated copper foil;

Subsequently, as an electrolyte solution, an aqueous solution containing 200 g/L of copper sulfate pentahydrate and 100 g/L of sulfuric acid and having a liquid temperature of 40° C. was used; in the electrolyte solution, an insoluble electrode of platinum-group oxide-coated titanium serving as an anode was immersed and the copper foil disposed so as to face the anode with a certain clearance therebetween, having the dendritic particle layer, and serving as a cathode was immersed; electrolysis was performed at an electric current density of 5.0 A/dm² and at a quantity of electricity of 440 C/dm² to thereby plate the dendritic particle layer with copper to form a roughened layer.

Comparative Example 10

Production was performed under the same conditions as in Example 1 except that, during formation of the roughened layer, firstly, as an electrolyte solution, an aqueous solution containing 47 g/L of copper sulfate pentahydrate, 95 g/L of sulfuric acid, 15 mg/L of tungsten ions, and 500 mg/L of titanium ions, and having a liquid temperature of 35° C. was used; in the electrolyte solution, an insoluble electrode of platinum-group oxide-coated titanium serving as an anode was immersed, and an untreated copper foil disposed so as to face the anode with a certain clearance therebetween and serving as a cathode was immersed; electrolysis was performed at an electric current density of 30.0 A/dm² and at a quantity of electricity of 95 C/dm² to form a dendritic particle layer on the untreated copper foil;

Subsequently, as an electrolyte solution, an aqueous solution containing 200 g/L of copper sulfate pentahydrate and 100 g/L of sulfuric acid and having a liquid temperature of 40° C. was used; in the electrolyte solution, an insoluble electrode of platinum-group oxide-coated titanium serving as an anode was immersed and the copper foil disposed so as to face the anode with a certain clearance therebetween, having the dendritic particle layer, and serving as a cathode was immersed; electrolysis was performed at an electric current density of 10.0 A/dm² and at a quantity of electricity of 250 C/dm² to thereby plate the dendritic particle layer with copper to form a roughened layer.

Comparative Example 11

Production was performed under the same conditions as in Example 1 except that, during formation of the finely roughened layer, the electrolysis conditions were changed to an electric current density of 1.3 A/dm² and a quantity of electricity of 15 C/dm², and, during formation of the heat-resistant-treatment layer, the electrolysis conditions were changed to a quantity of electricity of 3 C/dm².

Comparative Example 12

Production was performed under the same conditions as in Example 1 except that, during formation of the finely roughened layer, the electrolysis conditions were changed to an electric current density of 2.5 A/dm² and a quantity of electricity of 30 C/dm², and, during formation of the heat-resistant-treatment layer, the electrolysis conditions were changed to a quantity of electricity of 3 C/dm².

Comparative Example 13

Production was performed under the same conditions as in Example 1 except that, during formation of the heat-resistant-treatment layer, the electrolysis conditions were changed to an electric current density of 0.5 A/dm² and a quantity of electricity of 1.0 C/dm².

Comparative Example 14

Production was performed under the same conditions as in Example 1 except that, as the electrolyte solution for forming the heat-resistant-treatment layer, an aqueous solution containing 39 g/L of cobalt sulfate heptahydrate, 24 g/L of sodium molybdate dihydrate, 45 g/L of trisodium citrate dihydrate, and 40 g/L of sodium sulfate, having a pH of 5.6, and having a liquid temperature of 30° C. was used; in the electrolyte solution, an insoluble electrode of platinum-group oxide-coated titanium and serving as an anode was immersed, and a finely roughened copper foil disposed so as to face the anode with a certain clearance therebetween and serving as a cathode was immersed; electrolysis was performed at an electric current density of 7.0 A/dm² and at a quantity of electricity of 14 C/dm² to form, on the copper foil, a heat-resistant-treatment layer.

Comparative Example 15

Production was performed under the same conditions as in Example 1 except that, as the electrolyte solution for forming the heat-resistant-treatment layer, an aqueous solution containing 30 g/L of nickel sulfate hexahydrate and 10 g/L of sodium acetate trihydrate, having a pH of 4.5, and having a liquid temperature of 32° C. was used; in the electrolyte solution, an insoluble electrode of platinum-group oxide-coated titanium and serving as an anode was immersed, and a finely roughened copper foil disposed so as to face the anode with a certain clearance therebetween and serving as a cathode was immersed; electrolysis was performed at a quantity of electricity of 10 C/dm² to form, on the copper foil, a heat-resistant-treatment layer.

Comparative Example 16

Production was performed under the same conditions as in Example 1 except that, during formation of the heatresistant-treatment layer, the electrolysis conditions were changed to a quantity of electricity of 24 C/dm², during formation of the chromate treatment layer, as the electrolyte solution, an aqueous solution containing 20 g/L of sodium dichromate dihydrate, having a pH of 4.5, and having a liquid temperature of 25° C. was used, and the electrolysis conditions were changed to an electric current density of 2.2 A/dm² and a quantity of electricity of 3 C/dm².

Comparative Example 17

Production was performed under the same conditions as in Example 1 except that, during formation of the heat-resistant-treatment layer, the electrolysis conditions were changed to a quantity of electricity of 27 C/dm², during formation of the chromate treatment layer, as the electrolyte solution, an aqueous solution containing 20 g/L of sodium dichromate dihydrate, having a pH of 4.5, and having a liquid temperature of 25° C. was used, and the electrolysis conditions were changed to an electric current density of 2.2 A/dm² and a quantity of electricity of 3 C/dm².

The surface-treated copper foils of Examples and Comparative Examples will be described in [Table 1] and [Table 2].

TABLE 1

| | Untreated copper foil | | Roughened layer | | | Heat-resistant-treatment layer | | | | Treatment layer* | |
|---|---|---|---|---|---|---|---|---|---|---|---|
| Example | Type | Thickness (μm) | Sa (μm) | Electric current density (A/dm²) | Quantity of electricity (C/dm²) | Type | Nickel (g/L) | Phosphorus (g/L) | Electric current density (A/dm²) | Quantity of electricity (C/dm²) | C | S |
| 1 | Electro-deposited | 35 | 0.02 | 5.0 | 60 | Ni—P | 30 | 2.3 | 2.5 | 5 | Present | Present |
| 1a | | | | | | | | | | | Absent | Absent |
| 1b | | | | | | | | | | | Present | Absent |
| 1c | | | | | | | | | | | Absent | Present |
| 2 | Rolled | 18 | 0.09 | 5.0 | 60 | Ni—P | 30 | 2.3 | 2.5 | 10 | Present | Present |
| 3 | Electro-deposited | 18 | 0.02 | 5.0 | 60 | Ni—P | 30 | 2.3 | 2.5 | 3 | Present | Present |
| 3a | | | | | | | | | | | Absent | Absent |
| 3b | | | | | | | | | | | Present | Absent |
| 3c | | | | | | | | | | | Absent | Present |
| 4 | Electro-deposited | 18 | 0.02 | 7.0 | 80 | Ni—P | 30 | 2.3 | 2.5 | 3 | Present | Present |
| 5 | Electro-deposited | 12 | 0.16 | 5.0 | 60 | Ni—P | 30 | 2.3 | 2.5 | 10 | Present | Present |
| 6 | Electro-deposited | 18 | 0.25 | 5.0 | 60 | Ni—P | 30 | 2.3 | 2.5 | 10 | Present | Present |
| 7 | Rolled | 18 | 0.09 | 5.0 | 60 | Ni—P | 30 | 2.3 | 2.5 | 20 | Present | Present |
| 8 | Electro-deposited | 12 | 0.16 | 4.0 | 50 | Ni—P | 30 | 2.3 | 2.5 | 10 | Present | Present |
| 9 | Rolled | 18 | 0.09 | 5.0 | 60 | Ni—P | 30 | 2.3 | 0.4 | 10 | Present | Present |
| 10 | Rolled | 18 | 0.09 | 5.0 | 60 | Ni—P | 30 | 2.0 | 2.5 | 10 | Present | Present |
| 11 | Rolled | 18 | 0.09 | 5.0 | 60 | Ni—P | 30 | 2.3 | 2.5 | 5 | Present | Present |
| 12 | Rolled | 18 | 0.09 | 5.0 | 60 | Ni—P | 30 | 2.3 | 2.5 | 15 | Present | Present |

*C: chromate treatment layer/S: silane-coupling-agent treatment layer

TABLE 2

| | Untreated copper foil | | | Roughened layer | | | | Heat-resistant-treatment layer | | | |
|---|---|---|---|---|---|---|---|---|---|---|---|
| | | | | Roughening treatment | | Copper plating treatment | | | | | |
| Comparative Example | Type | Thickness (μm) | Sa (μm) | Electric current density (A/dm²) | Quantity of electricity (C/dm²) | Electric current density (A/dm²) | Quantity of electricity (C/dm²) | Type | Nickel (g/L) | Phosphorus (g/L) | Electric current density (A/dm²) | Quantity of electricity (C/dm²) |
| 1 | Electro-deposited | 18 | 0.02 | — | — | — | — | Ni—P | 30 | 2.3 | 2.5 | 5 |
| 2 | Electro-deposited | 18 | 0.02 | — | — | — | — | Ni—P | 30 | 2.3 | 2.5 | 3 |
| 3 | Rolled | 18 | 0.09 | — | — | — | — | Ni—P | 30 | 2.3 | 2.5 | 10 |
| 4 | Electro-deposited | 18 | 0.16 | — | — | — | — | Ni—P | 30 | 2.3 | 2.5 | 10 |
| 5 | Electro-deposited | 18 | 0.25 | — | — | — | — | Ni—P | 30 | 2.3 | 2.5 | 10 |
| 6 | Rolled | 18 | 0.09 | — | — | — | — | Ni—P | 30 | 2.3 | 2.5 | 20 |
| 7 | Rolled | 18 | 0.09 | — | — | — | — | Ni—P | 30 | 2.3 | 2.5 | 6 |
| 8 | Electro-deposited | 18 | 0.02 | 25.0 | 38 | — | — | Ni—P | 30 | 2.0 | 0.5 | 2 |

TABLE 2-continued

| | Untreated copper foil | | | Roughened layer | | | | Heat-resistant-treatment layer | | | | |
| | | | | Roughening treatment | | Copper plating treatment | | | | | | |
| Comparative Example | Type | Thickness (μm) | Sa (μm) | Electric current density (A/dm$^2$) | Quantity of electricity (C/dm$^2$) | Electric current density (A/dm$^2$) | Quantity of electricity (C/dm$^2$) | Type | Nickel (g/L) | Phosphorus (g/L) | Electric current density (A/dm$^2$) | Quantity of electricity (C/dm$^2$) |
|---|---|---|---|---|---|---|---|---|---|---|---|---|
| 9 | Electro-deposited | 18 | 0.02 | 50.0 | 125 | 5.0 | 440 | Ni—P | 30 | 2.3 | 2.5 | 5 |
| 10 | Electro-deposited | 18 | 0.02 | 30.0 | 95 | 10.0 | 250 | Ni—P | 30 | 2.3 | 2.5 | 5 |
| 11 | Electro-deposited | 18 | 0.02 | 1.3 | 15 | — | — | Ni—P | 30 | 2.3 | 2.5 | 3 |
| 12 | Electro-deposited | 18 | 0.02 | 2.5 | 30 | — | — | Ni—P | 30 | 2.3 | 2.5 | 3 |
| 13 | Rolled | 18 | 0.09 | 5.0 | 60 | — | — | Ni—P | 30 | 2.3 | 0.5 | 1 |
| 14 | Electro-deposited | 18 | 0.02 | 5.0 | 60 | — | — | Co•Mo | — | — | 7.0 | 14 |
| 15 | Rolled | 18 | 0.09 | 5.0 | 60 | — | — | Ni | 30 | — | 2.5 | 10 |
| 16 | Rolled | 18 | 0.09 | 5.0 | 60 | — | — | Ni—P | 30 | 2.3 | 2.5 | 24 |
| 17 | Rolled | 18 | 0.09 | 5.0 | 60 | — | — | Ni—P | 30 | 2.3 | 2.5 | 27 |

<Production of Copper-Clad Laminate>

The surface-treated copper foil of each of Examples and Comparative Examples was placed, with the treated surface serving as a bonding surface, on one or both of the surfaces of a 1 to 6-layer polyphenylene ether resin-containing base material (manufactured by Panasonic Corporation/MEGTRON7/nominal thickness: 0.06 mm), and subjected to, using a vacuum heat press machine (manufactured by KITAGAWA SEIKI CO., LTD./KVHC-II), heat-pressing in the air atmosphere, at a temperature of 200° C., and at a surface pressure of 4 MPa for 80 minutes, to provide a copper foil laminate.

The untreated copper foils and the surface-treated copper foils were evaluated in the following manner.

<Measurement of Surface Roughness>

A confocal microscope in accordance with the ISO25178-607, a laser microscope (manufactured by Olympus Corporation/LEXT OLS5000) was used to measure, in accordance with the JIS B 0681-3, arithmetic mean deviation Sa for an evaluation area of 125 μm×125 μm, with the S filter set to 0.5 μm, the L filter set to 50 μm, and the F operation set to multidimensional curved surfaces (three-dimensional).

<Measurement of Particle Size>

For the surfaces having a finely roughened layer of Examples and Comparative Examples, a field-emission scanning electron microscope (manufactured by JEOL Ltd./JSM-7800F) was used to measure, at a tilt angle of 0°, the largest diameter of 20 primary particles observed at a magnification of 100,000 to 200,000 (FIG. 6)

<Measurement of BET Specific Surface Area>

For the specific surface area of the surface-treated copper foil of each of Examples and Comparative Examples, a gas adsorption instrument (manufactured by MicrotracBEL Corp./BELSORP-MaxII) was used to measure, after degassing under a reduced pressure at room temperature for 5 hours, a krypton gas adsorption isotherm at the liquid nitrogen temperature (77 K), and the multipoint BET method was used to determine the specific surface area.

Measurement samples were cut out so as to have a sample area of 0.0150 m$^2$ or 0.0168 m$^2$ and the masses of the samples were defined as sample amounts.

<Calculation of Surface Area Ratio>

It was calculated by subjecting the value of the BET specific surface area to multiplication by the sample amount and to division by the sample area.

<Calculation of Nickel Coating Mass Per 1 m$^2$ of Surface Area>

The calculation was performed in the following manner: for the surface having the heat-resistant-treatment layer in the surface-treated copper foil of each of Examples and Comparative Examples, an X-ray fluorescence spectrometer (manufactured by Rigaku Corporation/ZSX Primus IV) was used to measure X-ray fluorescence intensity; from the intensity, the fundamental parameter method was used to calculate the nickel coating mass per 1 m$^2$ of the two-dimensional area; the determined values of the coating mass, the surface area ratio, and the two-dimensional area (=1 m$^2$) were substituted into [Math. 4].

$$\text{Nickel coating mass per 1 m}^2 \text{ of surface area (mg)} = \frac{\text{Nickel coating mass per 1 m}^2 \text{ of two-dimensional area (mg)}}{\text{Surface area ratio} \times \text{Two-dimensional area (m}^2)} \quad [\text{Math. 4}]$$

<Calculation of Phosphorus Coating Mass Per 1 m$^2$ of Surface Area>

The calculation was performed in the following manner: for the surface having the heat-resistant-treatment layer in the surface-treated copper foil of each of Examples and Comparative Examples, an X-ray fluorescence spectrometer (manufactured by Rigaku Corporation/ZSX Primus IV) was used to measure X-ray fluorescence intensity; the fundamental parameter method was used to calculate the phosphorus coating mass per 1 m$^2$ of the two-dimensional area; the determined values of the coating mass, surface area ratio, and two-dimensional area (=1 m$^2$) was substituted into [Math. 5].

[Math. 3]
$$\text{Phosphorus coating mass per 1 m}^2 \text{ of surface area (mg)} = \frac{\text{Phosphorus coating mass per 1 m}^2 \text{ of two-dimensional area(mg)}}{\text{Surface area ratio} \times \text{Two-dimensional area (m}^2)}$$

The copper-clad laminates were evaluated in the following manner.

<Heat Resistance Test>

The treated surfaces of the surface-treated copper foils of each of Examples and Comparative Examples were placed, with the treated surfaces serving as bonding surfaces, on both surfaces of a 6-layer polyphenylene ether resin-containing base material (manufactured by Panasonic Corporation/MEGTRON7/nominal thickness: 0.06 mm), and subjected to, using a vacuum heat press machine (manufactured by KITAGAWA SEIKI CO., LTD./KVHC-II), heat-pressing in the air atmosphere, at a temperature of 200° C., and at a surface pressure of 4 MPa for 80 minutes, to provide a double-sided copper-clad laminate.

In accordance with JIS C6481, each of such double-sided copper-clad laminates was cut to provide 5 test pieces having dimensions 5 cm×5 cm, and held in a thermostat having an air circulation function in the air atmosphere and at each of temperatures of 260° C. and 280° C. for 1 hour.

The test pieces after the heat resistance test at the temperatures were visually observed; the number of test pieces in which delamination occurred between the resin base material and the copper foil was measured and evaluated in the following manner.

A: the number of test pieces in which delamination occurred at temperatures of 280° C. or less is 0

B: the number of test pieces in which delamination occurred at temperatures of 280° C. or less is 1 to 5

For Examples and Comparative Examples in which the chromate treatment layer and the silane-coupling-agent treatment layer were formed, the test pieces were held at a temperature of 290° C. for 1 hour and the number of test pieces in which delamination occurred was measured.

<Interlayer Adhesion Test>

The treated surface of the surface-treated copper foil of each of Examples and Comparative Examples was first placed, with the treated surface serving as a bonding surface, on a single surface of a polyphenylene ether resin-containing base material (manufactured by Panasonic Corporation/MEGTRON7/nominal thickness: 0.06 mm), and subjected to heat-pressing, using a vacuum heat press machine (manufactured by KITAGAWA SEIKI CO., LTD./KVHC-II) in the air atmosphere, at a temperature of 200° C., and at a surface pressure of 4 MPa for 80 hours, to provide a single-sided copper-clad laminate.

Subsequently, the copper foil part of the single-sided copper-clad laminate was subjected to whole-surface etching using a copper chloride etchant, rinsing, and drying; furthermore, on the surface in which the copper foil was etched, a single polyphenylene ether resin-containing base material was placed; heat-pressing was performed using a vacuum press machine (manufactured by KITAGAWA SEIKI CO., LTD./KVHC-II) under the above-described conditions, to produce a pseudo-multilayer plate.

Each of such pseudo-multilayer plates was cut to provide 5 test pieces having dimensions of 5 cm×5 cm, subjected to, as a pretreatment, a boiling treatment in pure water for 6 hours, and subsequently vertically immersed in a solder bath at 288° C. and held for 30 seconds.

The test pieces after the interlayer adhesion test were visually observed; the number of test pieces in which delamination occurred at the interface between the insulating resin base material and the insulating resin base material was measured and evaluated in the following manner.

A: 0 test pieces

B: 1 to 5 test pieces

<Transmission Characteristics>

The treated surfaces of the surface-treated copper foils of each of Examples and Comparative Examples were placed, with the treated surfaces serving as bonding surfaces, on both surfaces of a single polyphenylene ether resin-containing base material (manufactured by Panasonic Corporation/MEGTRON7/nominal thickness: 0.06 mm), and subjected to heat-pressing using a vacuum heat press machine (manufactured by KITAGAWA SEIKI CO., LTD./KVHC-II) in the air atmosphere, at a temperature of 200° C., and at a surface pressure of 4 MPa for 80 minutes, to provide a double-sided copper-clad laminate.

In the obtained double-sided copper foil laminate, an etching machine (manufactured by Ninomiya System Co., Ltd./SPE-40) was used to form a single-end microstrip circuit, to provide a test piece.

Note that the test piece was formed so as to have a circuit length of 100 mm and a circuit width of 190 μm in order to provide a characteristic impedance of 50Ω.

For the test piece, a network analyzer (manufactured by Keysight Technologies/E5071C) was used to measure the S parameter (S21) at a frequency of 20 GHz, and evaluation was performed in the following manner.

A: −3 dB/100 mm or more

B: less than −3 dB/100 mm

<Overall Evaluation>

On the basis of the evaluations of the heat resistance test, the interlayer adhesion test, and the transmission characteristics, overall evaluation was performed in the following manner.

A: a case where the evaluation grades of the tests are all A's

B: a case where the evaluation grades of the tests include one or more B's

An evaluation simulating via formation in a printed wiring board was performed in the following manner.

<Soft Etching Property>

In the step of forming a blind via in a printed wiring board, the surface preparation treatment for the copper foil surface was simulated and an evaluation of removability of the copper foil surface including the finely roughened layer was performed by evaluating the soft etching property.

The surface-treated copper foils of Examples 9 to 12 and Comparative Examples 15 to 17 were cut out to dimensions of 5 cm×5 cm and these were heated in the air atmosphere and at a temperature of 300° C. for 100 seconds to provide test pieces.

As the soft etching solution, an aqueous solution containing 200 mL of sulfuric acid and 25 mL/L of hydrogen peroxide and having a liquid temperature of 40° C. was used; each of the test pieces was immersed in the soft etching solution, and the time (seconds) elapsed until the finely roughened layer was dissolved and the base of the treated copper foil (untreated copper foil) was visually observed was measured and evaluated in the following manner.

A: less than 30 seconds
B: 30 seconds or more and less than 60 seconds
C: 60 seconds or more and less than 120 seconds
D: 120 seconds or more The results of heat resistance, interlayer adhesion, and transmission characteristics of the surface-treated copper foils of Examples and Comparative Examples will be described in [Table 3] to [Table 6].

The results of the soft etching property of the surface-treated copper foils of Examples and Comparative Examples will be described in [Table 7].

TABLE 3

| Example | Primary particle size (nm) | Sa (μm) | BET specific surface area (m²/g) | Sample amount (g) | Sample area (m²) | Surface area (m²) | Per 1 m² of two-dimensional area Nickel (mg) | Per 1 m² of two-dimensional area Phosphorus (mg) | Surface area ratio | Per 1 m² of surface area Nickel (mg) | Per 1 m² of surface area Phosphorus (mg) |
|---|---|---|---|---|---|---|---|---|---|---|---|
| 1 | 10-110 | 0.08 | 0.032 | 4.61 | 0.0168 | 0.148 | 104.3 | 3.2 | 8.8 | 11.9 | 0.36 |
| 1a | | 0.08 | 0.033 | 4.60 | 0.0168 | 0.152 | 105.2 | 3.3 | 9.0 | 11.6 | 0.37 |
| 1b | | 0.08 | 0.032 | 4.64 | 0.0168 | 0.148 | 103.2 | 3.1 | 8.8 | 11.7 | 0.35 |
| 1c | | 0.08 | 0.031 | 4.61 | 0.0168 | 0.143 | 105.1 | 3.2 | 8.5 | 12.4 | 0.38 |
| 2 | 10-110 | 0.12 | 0.051 | 2.35 | 0.0150 | 0.120 | 223.9 | 4.4 | 8.0 | 28.0 | 0.55 |
| 3 | 10-110 | 0.02 | 0.059 | 2.26 | 0.0150 | 0.133 | 34.8 | 1.2 | 8.9 | 3.9 | 0.13 |
| 3a | | 0.02 | 0.061 | 2.22 | 0.0150 | 0.135 | 36.5 | 1.3 | 9.0 | 4.0 | 0.14 |
| 3b | | 0.02 | 0.060 | 2.23 | 0.0150 | 0.134 | 34.1 | 1.2 | 8.9 | 3.8 | 0.13 |
| 3c | | 0.02 | 0.060 | 2.27 | 0.0150 | 0.136 | 33.5 | 1.1 | 9.1 | 3.7 | 0.12 |
| 4 | 10-110 | 0.05 | 0.085 | 2.07 | 0.0150 | 0.176 | 41.7 | 1.5 | 11.8 | 3.5 | 0.13 |
| 5 | 10-110 | 0.23 | 0.054 | 1.63 | 0.0150 | 0.088 | 219.8 | 8.8 | 5.9 | 37.5 | 1.50 |
| 6 | 10-110 | 0.34 | 0.043 | 2.42 | 0.0168 | 0.104 | 223.8 | 6.2 | 6.2 | 36.2 | 1.00 |
| 7 | 10-110 | 0.14 | 0.049 | 2.44 | 0.0150 | 0.120 | 438.4 | 8.5 | 8.0 | 54.8 | 1.06 |
| 8 | 10-110 | 0.22 | 0.049 | 1.62 | 0.0150 | 0.083 | 211.4 | 8.2 | 5.5 | 38.4 | 1.49 |

TABLE 4

| Example | Heat resistance 260 (°C.) | Heat resistance 280 (°C.) | Evaluation | Interlayer adhesion 290 (°C.) | Interlayer adhesion 288 (°C.) | Evaluation | Transmission characteristics (S21@20 GHz) (dB/100 mm) | Evaluation | Overall evaluation |
|---|---|---|---|---|---|---|---|---|---|
| 1 | 0 | 0 | A | 0 | 0 | A | -2.7 | A | A |
| 1a | 0 | 0 | A | — | 0 | A | -2.7 | A | A |
| 1b | 0 | 0 | A | — | 0 | A | -2.7 | A | A |
| 1c | 0 | 0 | A | — | 0 | A | -2.7 | A | A |
| 2 | 0 | 0 | A | 0 | 0 | A | -2.8 | A | A |
| 3 | 0 | 0 | A | 0 | 0 | A | -2.6 | A | A |
| 3a | 0 | 0 | A | — | 0 | A | -2.6 | A | A |
| 3b | 0 | 0 | A | — | 0 | A | -2.6 | A | A |
| 3c | 0 | 0 | A | — | 0 | A | -2.6 | A | A |
| 4 | 0 | 0 | A | 0 | 0 | A | -2.6 | A | A |
| 5 | 0 | 0 | A | 0 | 0 | A | -2.9 | A | A |
| 6 | 0 | 0 | A | 0 | 0 | A | -2.9 | A | A |
| 7 | 0 | 0 | A | 0 | 0 | A | -2.8 | A | A |
| 8 | 0 | 0 | A | 0 | 0 | A | -2.9 | A | A |

TABLE 5

| Comparative Example | Primary particle size (nm) | Sa (μm) | BET specific surface area (m²/g) | Sample amount (g) | Sample area (m²) | Surface area (m²) | Per 1 m² of two-dimensional area Nickel (mg) | Per 1 m² of two-dimensional area Phosphorus (mg) | Surface area ratio | Per 1 m² of surface area Nickel (mg) | Per 1 m² of surface area Phosphorus (mg) |
|---|---|---|---|---|---|---|---|---|---|---|---|
| 1 | — | 0.02 | 0.018 | 2.02 | 0.0150 | 0.036 | 127.0 | 3.6 | 2.4 | 52.9 | 1.50 |
| 2 | — | 0.02 | 0.023 | 2.25 | 0.0150 | 0.052 | 35.5 | 2.7 | 3.5 | 10.3 | 0.78 |
| 3 | — | 0.09 | 0.015 | 2.24 | 0.0150 | 0.034 | 174.1 | 2.8 | 2.3 | 76.8 | 1.24 |
| 4 | — | 0.16 | 0.020 | 2.01 | 0.0150 | 0.039 | 176.5 | 2.8 | 2.6 | 67.9 | 1.08 |
| 5 | — | 0.25 | 0.019 | 2.06 | 0.0150 | 0.039 | 180.6 | 2.8 | 2.6 | 69.5 | 1.08 |
| 6 | — | 0.09 | 0.016 | 2.00 | 0.0150 | 0.034 | 565.9 | 26.5 | 2.3 | 249.7 | 11.69 |
| 7 | — | 0.09 | 0.016 | 2.15 | 0.0150 | 0.034 | 129.7 | 7.5 | 2.3 | 57.2 | 3.31 |

TABLE 5-continued

| Comparative Example | Primary particle size (nm) | Sa (μm) | BET specific surface area (m²/g) | Sample amount (g) | Sample area (m²) | Surface area (m²) | Per 1 m² of two-dimensional area | | Surface area ratio | Per 1 m² of surface area | |
|---|---|---|---|---|---|---|---|---|---|---|---|
| | | | | | | | Nickel (mg) | Phosphorus (mg) | | Nickel (mg) | Phosphorus (mg) |
| 8 | 80-140 | 0.02 | 0.025 | 2.03 | 0.0150 | 0.051 | 26.8 | 1.6 | 3.4 | 7.9 | 0.47 |
| 9 | 1400-1900 | 0.12 | 0.028 | 2.31 | 0.0150 | 0.065 | 128.3 | 3.1 | 4.3 | 29.8 | 0.72 |
| 10 | 600-1200 | 0.33 | 0.046 | 2.22 | 0.0150 | 0.102 | 116.7 | 1.5 | 6.8 | 17.2 | 0.22 |
| 11 | 10-110 | 0.02 | 0.028 | 2.27 | 0.0150 | 0.063 | 34.7 | 2.5 | 4.2 | 8.2 | 0.59 |
| 12 | 10-110 | 0.03 | 0.033 | 2.27 | 0.0150 | 0.075 | 33.7 | 2.1 | 5.0 | 6.8 | 0.42 |
| 13 | 10-110 | 0.14 | 0.052 | 2.51 | 0.0150 | 0.130 | 10.5 | 0.3 | 8.7 | 1.2 | 0.04 |
| 14 | 10-110 | 0.08 | 0.055 | 2.40 | 0.0150 | 0.130 | 0 | 0 | 8.7 | 0 | 0 |

TABLE 6

| Comparative Example | Heat resistance | | | Interlayer adhesion | | | Transmission characteristics | | Overall evaluation |
|---|---|---|---|---|---|---|---|---|---|
| | 260 (°C.) | 280 (°C.) | Evaluation | 290 (°C.) | 288 (°C.) | Evaluation | (S21@20 GHz) (dB/100 mm) | Evaluation | |
| 1 | 3 | 5 | B | 5 | 5 | B | −2.7 | A | B |
| 2 | 1 | 3 | B | 5 | 5 | B | −2.6 | A | B |
| 3 | 2 | 3 | B | 5 | 5 | B | −2.8 | A | B |
| 4 | 1 | 2 | B | 5 | 5 | B | −2.8 | A | B |
| 5 | 1 | 1 | B | 5 | 5 | B | −2.9 | A | B |
| 6 | 1 | 2 | B | 5 | 5 | B | −2.7 | A | B |
| 7 | 3 | 4 | B | 5 | 5 | B | −2.8 | A | B |
| 8 | 0 | 1 | B | 3 | 4 | B | −2.7 | A | B |
| 9 | 1 | 3 | B | 5 | 3 | B | −3.0 | A | B |
| 10 | 0 | 0 | A | 0 | 0 | A | −3.5 | B | B |
| 11 | 0 | 3 | B | 5 | 5 | B | −2.7 | A | B |
| 12 | 0 | 3 | B | 2 | 4 | B | −2.6 | A | B |
| 13 | 0 | 5 | B | 5 | 0 | A | −2.6 | A | B |
| 14 | 0 | 5 | B | 5 | 0 | A | −2.7 | A | B |

TABLE 7

| | | Primary particle size (nm) | Sa (μm) | BET specific surface area (m²/g) | Sample amount (g) | Sample area (m²) | Surface area (m²) | Per 1 m² of two-dimensional area | | Surface area ratio | Per 1 m² of surface area | | Soft etching | |
|---|---|---|---|---|---|---|---|---|---|---|---|---|---|---|
| | | | | | | | | Nickel (mg) | Phosphorus (mg) | | Nickel (mg) | Phosphorus (mg) | Seconds | Evaluation |
| Example | 9 | 10-110 | 0.12 | 0.055 | 2.28 | 0.0150 | 0.13 | 239.2 | 1.1 | 8.4 | 28.6 | 0.13 | 56 | B |
| | 10 | 10-110 | 0.12 | 0.053 | 2.24 | 0.0150 | 0.12 | 223.4 | 5.3 | 7.9 | 28.2 | 0.67 | 20 | A |
| | 11 | 10-110 | 0.11 | 0.051 | 2.41 | 0.0150 | 0.12 | 97.5 | 4.3 | 8.2 | 11.9 | 0.52 | 5 | A |
| | 12 | 10-110 | 0.11 | 0.052 | 2.37 | 0.0150 | 0.12 | 315.9 | 6.4 | 8.2 | 38.4 | 0.78 | 46 | B |
| Comparative | 15 | 10-110 | 0.12 | 0.056 | 2.30 | 0.0150 | 0.13 | 243.6 | 0 | 8.6 | 28.4 | 0 | 124 | D |
| ative | 16 | 10-110 | 0.12 | 0.050 | 2.37 | 0.0150 | 0.12 | 481.1 | 9.2 | 7.9 | 50.9 | 1.16 | 107 | C |
| Example | 17 | 10-110 | 0.12 | 0.051 | 2.35 | 0.0150 | 0.12 | 541.6 | 10.1 | 8.0 | 67.8 | 1.26 | 255 | D |

Examples 1 to 8 have demonstrated that the insertion losses of the surface-treated copper foils according to the present invention are, even at a high frequency of 20 GHz, −3 dB/100 mm or more, which are similar to those of the unroughened foils (Comparative Examples 1 to 7), and, for the copper-clad laminates including the surface-treated copper foils according to the present invention, the surface-treated copper foils have such high heat resistance that, even upon heating at a temperature of 280° C. for 1 hour, delamination at the interface between the insulating resin base material and such a copper foil does not occur.

In addition, it has been demonstrated that the copper-clad laminates including the surface-treated copper foils according to the present invention in which surfaces having been subjected to copper etching are bonded to new insulating resin base materials also provide high interlayer adhesion.

In addition, Examples 9 to 12 have demonstrated that, for the surface-treated copper foils according to the present invention, the soft etching times are less than 60 seconds and a good soft etching property is exhibited.

INDUSTRIAL APPLICABILITY

A surface-treated copper foil according to the present invention includes a roughened layer having a three-dimensional structure formed of a plurality of fine copper particles connected together and having a high surface area ratio per 1 m² of the two-dimensional area to provide a strong anchoring effect, to thereby exhibit high adhesion even to low-polarity low-dielectric-constant resin base materials; the surface-treated copper foil includes a heat-resistant-treatment layer containing different metals of nickel and phosphorus, and hence, even upon exposure to high temperatures for a long time, swelling and delamination are less likely to occur at the interface between the insulating resin base material and the copper foil.

The present invention also provides a surface-treated copper foil in which insertion loss can be suppressed as in unroughened copper foils and hence the transmission characteristics are good; in addition, such insulating resin base materials can be bonded together, so that, in the case of forming a multilayer, a multilayer printed wiring board having high interlayer adhesion can be produced; thus, the surface-treated copper foil can be suitably used for printed wiring boards for transmission of high-frequency signals.

Therefore, the present invention is an invention having high industrial applicability.

The invention claimed is:

1. A surface-treated copper foil comprising, on at least one surface of an untreated copper foil, a roughened layer, and a heat-resistant-treatment layer disposed on the roughened layer, wherein the roughened layer is a finely roughened layer formed of copper particles in which primary particles have a particle size of 10 nm or more and 110 nm or less, the heat-resistant-treatment layer contains nickel and phosphorus, a treated surface of the surface-treated copper foil has a surface area ratio of 5.1 or more per 1 m² of a two-dimensional area, the surface area ratio being calculated from a specific surface area measured by a krypton gas adsorption BET method, and a coating mass of the nickel per 1 m² of a surface area is 2 mg or more.

2. The surface-treated copper foil according to claim 1, wherein the coating mass of the nickel per 1 m² of the surface area is 60 mg or less.

3. The surface-treated copper foil according to claim 1, wherein a coating mass of the phosphorus per 1 m² of the surface area is 0.1 mg or more.

4. The surface-treated copper foil according to claim 1, wherein the treated surface has an arithmetic mean deviation Sa of 0.02 μm or more and 0.35 μm or less.

5. The surface-treated copper foil according to claim 1, comprising, on the heat-resistant-treatment layer, a chromate treatment layer and/or a silane-coupling-agent treatment layer.

6. A copper-clad laminate in which the surface-treated copper foil according to claim 1 is bonded to an insulating resin base material.

7. The copper-clad laminate according to claim 6, wherein the insulating resin base material is a low-dielectric-constant resin base material.

8. A printed wiring board or multilayer printed wiring board formed using the copper-clad laminate according to claim 6.

* * * * *